United States Patent
Roberson et al.

(10) Patent No.: US 10,686,432 B2
(45) Date of Patent: Jun. 16, 2020

(54) WAVEFORM GENERATION CIRCUIT FOR FINELY TUNABLE SENSING FREQUENCY

(71) Applicant: SYNAPTICS INCORPORATED, San Jose, CA (US)

(72) Inventors: Jeremy Roberson, San Jose, CA (US); David Sobel, Los Altos, CA (US); Damien Berget, Sunnyvale, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/201,600

(22) Filed: Nov. 27, 2018

(65) Prior Publication Data

US 2020/0067495 A1 Feb. 27, 2020

Related U.S. Application Data

(60) Provisional application No. 62/722,798, filed on Aug. 24, 2018.

(51) Int. Cl.
| | |
|---|---|
| *H03K 4/94* | (2006.01) |
| *H03K 3/01* | (2006.01) |
| *H03K 5/04* | (2006.01) |
| *H03K 5/003* | (2006.01) |
| *G06F 3/044* | (2006.01) |
| *G06F 3/041* | (2006.01) |
| *H03K 5/00* | (2006.01) |

(52) U.S. Cl.
CPC .............. *H03K 4/94* (2013.01); *G06F 3/044* (2013.01); *G06F 3/0416* (2013.01); *H03K 3/01* (2013.01); *H03K 5/003* (2013.01); *H03K 5/04* (2013.01); *G06F 2203/04101* (2013.01); *H03K 2005/00286* (2013.01)

(58) Field of Classification Search
CPC ............ H03K 4/94; H03K 3/01; H03K 5/003; H03K 5/04; H03K 2005/00286; G06F 3/0416; G06F 3/044; G06F 2203/04101
See application file for complete search history.

(56) References Cited

U.S. PATENT DOCUMENTS

| | | | | |
|---|---|---|---|---|
| 4,278,977 A | * | 7/1981 | Nossen | G01S 13/79 342/125 |
| 9,780,766 B1 | * | 10/2017 | Feldtkeller | H03K 5/135 |
| 2016/0378265 A1 | * | 12/2016 | Katsurahira | G06F 3/0418 345/174 |

* cited by examiner

*Primary Examiner* — Afroza Chowdhury
(74) *Attorney, Agent, or Firm* — Patterson + Sheridan, LLP

(57) ABSTRACT

Embodiments disclosed herein generally relate to electronic devices, and more specifically, to a waveform generation circuit for input devices. One or more embodiments provide a new waveform generator for an integrated touch and display driver (TDDI) and methods for generating a waveform for capacitive sensing with a finely tunable sensing frequency. A waveform generator includes accumulator circuitry, truncation circuitry, and saturation circuitry. The accumulator circuitry is configured to accumulate the phase increment value based on a clock signal, and output the accumulated phase increment value. The truncation circuitry configured to drop one or more bits of the accumulated phase increment value to output a truncated value. The saturation circuitry is configured to compare the truncated value to a saturation limit and output a signal corresponding to accessed data samples.

27 Claims, 7 Drawing Sheets

US 10,686,432 B2

WAVEFORM GENERATION CIRCUIT FOR FINELY TUNABLE SENSING FREQUENCY

CROSS-REFERENCE TO RELATED APPLICATIONS

This application claims benefit of U.S. provisional patent application Ser. No. 62/722,798, filed Aug. 24, 2018, entitled "Waveform Generation Circuit For Finely Tunable Sensing Frequency," which is herein incorporated by reference.

BACKGROUND

Field

Embodiments disclosed herein generally relate to electronic devices, and more specifically, to a waveform generation circuit for input devices.

Description of the Related Art

Input devices including proximity sensor devices may be used in a variety of electronic systems. A proximity sensor device may include a sensing region, demarked by a surface, in which the proximity sensor device determines the presence, location, force and/or motion of one or more input objects. Proximity sensor devices may be used to provide interfaces for the electronic system. For example, proximity sensor devices may be used as input devices for larger computing systems, such as touchpads integrated in, or peripheral to, notebook or desktop computers. Proximity sensor devices may also often be used in smaller computing systems, such as touch screens integrated in cellular phones or vehicles (e.g., automobiles).

SUMMARY

Embodiments disclosed herein generally relate to electronic devices, and more specifically, to a waveform generator for input devices. In one or more embodiments, a waveform generator includes accumulator circuitry, truncation circuitry, and saturation circuitry. The accumulator circuitry is configured to accumulate a phase increment value based on a clock signal. The truncation circuitry is configured to drop one or more bits of the accumulated phase increment value to generate a truncated value. The saturation circuitry is configured to compare the truncated value to a saturation limit, if the truncated value is below the saturation limit, access a data sample from a random access memory (RAM) address corresponding to the truncated value, or if the truncated value is above the saturation limit, access a data sample from a RAM address corresponding to the saturation limit, and output a signal corresponding to the accessed data sample.

In one embodiment, an input device comprises a sensing device and a waveform generator. The sensing device comprises a plurality of sensor electrodes and a sensing driver. The sensing driver is communicatively coupled to the plurality of sensor electrodes and configured to acquire sensor data from the plurality of sensor electrodes by driving the plurality of sensor electrodes with a sensing signal. The waveform generator comprises circuitry configured to generate address bits for fractionally incrementing a random access memory (RAM) address per clock cycle to access samples of a waveform of the sensing signal, circuitry configured to change a frequency of the sensing signal by adjusting a number of clock cycles in a half period of the waveform, and circuitry configured to control a shape of the waveform by adjusting at least one of a phase increment value and a saturation limit value.

In an embodiment, a method for generating a waveform comprises generating a period of the waveform by setting a number of clock cycles for a half period of the waveform, accessing a random access memory (RAM), and generating a shape of the waveform. Accessing the RAM includes incrementing a RAM address value using a phase increment value, accumulating the phase increment value based on a clock cycle, and truncating the accumulated phase increment value to fractionally increment the RAM address value. Generating a shape of the waveform, wherein generating the shape includes comparing the truncated value to a saturation limit, if the truncated value is below the saturation limit, accessing a data sample from a RAM address corresponding to the truncated value, or if the truncated value is above the saturation limit, accessing a data sample from a RAM address corresponding to the saturation limit, and outputting a signal corresponding to the accessed data sample.

In one or more embodiments, a processing system including the waveform generator and a method for generating a waveform are provided.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

Figure 1:
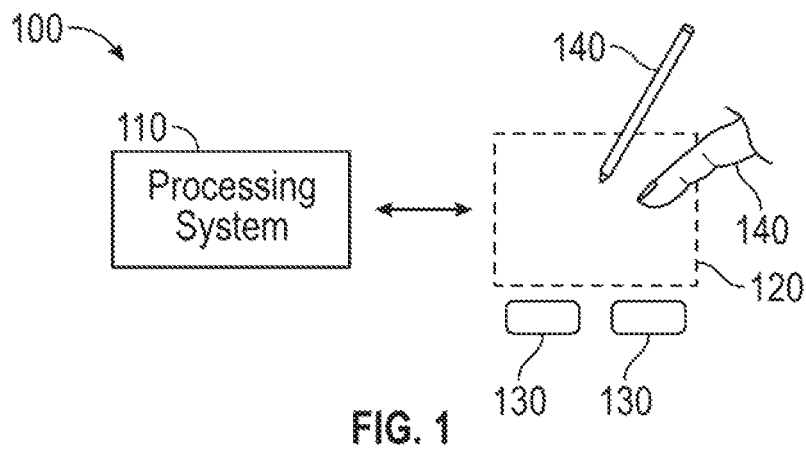
FIG. 1 is a schematic block diagram of an input device, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified, and details or components are omitted for clarity of presentation and explanation. The

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

In one or more embodiments, an input device includes sensor electrodes that are driven to acquire sensor data which may be used to determine positional information for one or more input objects. In such embodiments, the sensor data may include the effects of interference, which may make it difficult to determine the positional information for an input object proximate and/or in contact with the input device. For example, the sensor electrodes may be disposed over a display panel of a display device, and as the display panel is updated, display update signals are driven onto the display electrodes of the display panel. The display update signals may inject interference into the sensor data, negatively affecting the sensor data; however, display induced interference is difficult to measure and compensate for using current approaches as the interference changes each time the display panel is updated. In the following, various systems and methods having improved methods for compensating for the display interference are described.

Turning now to the figures, FIG. 1 is a block diagram of an exemplary input device 100, in accordance with embodiments of the disclosure. The input device 100 may be configured to provide input to an electronic system (not shown). As used in this document, the term "electronic system" broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices, e.g., remote controllers and mice, and data output devices, e.g., display screens and printers. Other examples include remote terminals, kiosks, and video game machines, e.g., video game consoles, portable gaming devices, and the like. Other examples include communication devices, e.g., cellular phones such as smart phones, and media devices, e.g., recorders, editors, and players such as televisions, set-top boxes, music players, digital photo frames, and digital cameras. Additionally, the electronic system could be a host or a slave to the input device. The electronic system may also be referred to as electronic device.

The input device 100 can be implemented as a physical part of the electronic system or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device configured to sense input provided by one or more input objects 140 in a sensing region 120. Example input objects 140 include fingers and styli, as shown in FIG. 1. An exemplary proximity sensor device may be a touchpad, a touch screen, a touch sensor device and the like.

Sensing region 120 encompasses any space above, around, in and/or near the input device 100 in which the input device 100 is able to detect user input, e.g., user input provided by one or more input objects 140. The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiment's sense input that comprises: no contact with any surfaces of the input device 100; contact with an input surface, e.g. a touch surface, of the input device 100: contact with an input surface of the input device 100 coupled with some amount of applied force or pressure; and/or a combination thereof. In various embodiments, input surfaces may be provided by surfaces of casings within which the sensor electrodes (also referred to herein as sensing electrodes) reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self-capacitance" (also often referred to as "absolute capacitance")

sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage, e.g. system ground, and by detecting the capacitive coupling between the sensor electrodes and input objects.

Some capacitive implementations utilize "mutual capacitance" (also often referred to as "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also referred to herein as "transmitter electrodes" or "transmitters") and one or more receiver sensor electrodes (also referred to herein as "receiver electrodes" or "receivers"). Transmitter sensor electrodes may be modulated relative to a reference voltage, e.g., system ground, to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference, e.g. other electromagnetic signals. Sensor electrodes may be dedicated transmitters or receivers or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (in another embodiment, with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system, e.g., to a central processing system of the electronic system that is separate from the processing system 110, if such a separate central processing system exists. In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of a display screen. For example, the sensing region 120 may overlap at least a portion of an active area of a display screen. The active area of the display screen may correspond to a portion of the display screen where images are updated. In one or more embodiments, the input device 100 may comprise substantially transparent sensor electrodes overlaying the display screen and provide a touch screen interface for the associated electronic system. The display screen may be any type of dynamic display capable of displaying a visual interface to a user and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110. The display screen may also be referred to as a display panel.

It should be understood that while many embodiments of the disclosure are described in the context of a fully functioning apparatus, the mechanisms of the present disclosure are capable of being distributed as a program product, e.g., software, in a variety of forms. For example, the mechanisms of the present disclosure may be implemented and distributed as a software program on information bearing media that are readable by electronic processors, e.g., non-transitory computer-readable and/or recordable/writable information bearing media readable by the processing system 110. Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
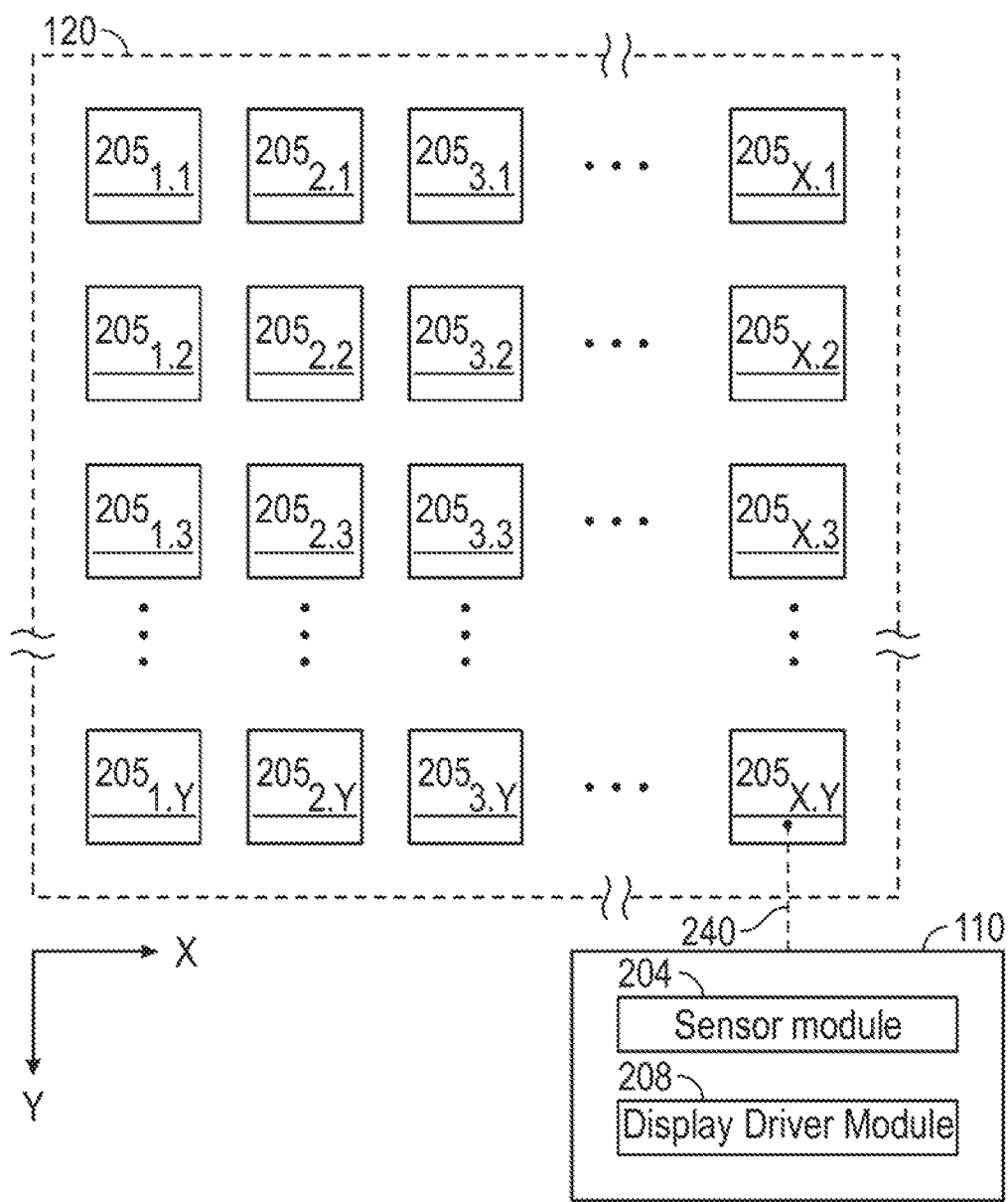
FIG. 2 illustrates an example display device and sensor device, according to one or more embodiments.

FIG. 2 shows a portion of an exemplary pattern of capacitive pixels 205 (also referred to herein as capacitive pixels or sensing pixels) configured to sense in the sensing region 120 associated with a pattern, according to some embodiments. Each capacitive pixel 205 may include one of more of the sensing elements described above. For clarity of illustration and description, FIG. 2 presents the regions of the capacitive pixels 205 in a pattern of simple rectangles and does not show various other components within the capacitive pixels 205. In one embodiment, the capacitive pixels 205 are areas of localized capacitance of corresponding sensor electrodes. Capacitive pixels 205 may be formed between an individual sensor electrode and ground in a first mode of operation and between groups of sensor electrodes used as transmitter and receiver electrodes in a second mode of operation. The capacitive coupling changes with the proximity and motion of input objects in the sensing region 120 associated with the capacitive pixels 205, and thus may be used as an indicator of the presence of the input object in the sensing region 120 of the input device.

The exemplary pattern comprises an array of capacitive pixels $205_{X,Y}$ (referred collectively as capacitive pixels 205) arranged in X columns and Y rows in a common plane, wherein X and Y are positive integers, although one of X and Y may be zero. It is contemplated that the pattern of capacitive pixels 205 may comprises a plurality of capacitive pixels 205 having other configurations, such as polar arrays, repeating patterns, non-repeating patterns, non-uniform arrays a single row or column, or other suitable arrangement. Further, as will be discussed in more detail below, the sensor electrodes in the capacitive pixels 205 may be any shape such as circular, rectangular, diamond, star, square, noncovex, convex, nonconcave concave, etc. As shown here, the capacitive pixels 205 are coupled to the processing system 110 and utilized to determine the presence of (or lack thereof) an input object in the sensing region 120.

In a first mode of operation, at least one sensor electrode within the capacitive pixels 205 may be utilized to detect the presence of an input object via absolute sensing techniques. A sensor module 204 in processing system 110 is configured to drive a sensor electrode using a trace 240 in each capacitive pixel 205 with a an absolute capacitive sensing signal and measure a capacitance between the sensor electrode and the input object based on the absolute capacitive sensing signal, which is utilized by the processing system 110 or other processor to determine the position of the input object. The absolute capacitive sensing signal may be a modulated signal comprising a varying voltage.

The various electrodes of capacitive pixels 205 are typically ohmically isolated from the electrodes of other capacitive pixels 205. Additionally, where a capacitive pixel 205 includes multiple electrodes, the electrodes may be ohmically isolated from each other. That is, one or more insulators separate the sensor electrodes and prevent them from electrically shorting to each other.

In a second mode of operation, sensor electrodes in the capacitive pixels 205 are utilized to detect the presence of an input object via transcapacitance sensing techniques. That is, processing system 110 may drive at least one sensor electrode in a capacitive pixel 205 with a transmitter signal and receive resulting signals using one or more of the other sensor electrodes in the capacitive pixel 205, where a resulting signal comprising effects corresponding to the transmitter signal. The resulting signal is utilized by the processing system 110 or other processor to determine the position of the input object. The sensor electrodes that are driven with the transmitter signal are modulated by the transmitter signal relative to the sensor electrodes that receive the resulting signals. In one embodiment, both the sensor electrodes that are driven with the transmitter signal and the sensor electrodes that receive the resulting signals are modulated.

The input device 100 may be configured to operate in any one of the modes described above. The input device 100 may also be configured to switch between the two modes described above.

In some embodiments, the capacitive pixels 205 are "scanned" to determine these capacitive couplings. That is, in one embodiment, one or more of the sensor electrodes are driven to transmit transmitter signals. Transmitters may be operated such that one transmitter electrode transmits at one time, or multiple transmitter electrodes transmit at the same time. Where multiple transmitter electrodes transmit simultaneously, the multiple transmitter electrodes may transmit the same transmitter signal and effectively produce an effectively larger transmitter electrode. Alternatively, the multiple transmitter electrodes may transmit different transmitter signals. For example, multiple transmitter electrodes may transmit different transmitter signals according to one or more coding schemes that enable their combined effects on the resulting signals of receiver electrodes to be independently determined.

The sensor electrodes configured as receiver sensor electrodes may be operated singly or multiply to acquire resulting signals. The resulting signals may be used to determine measurements of the capacitive couplings at the capacitive pixels 205.

In other embodiments, "scanning" capacitive pixels 205 to determine these capacitive coupling includes driving with an absolute capacitive sensing signal and measuring the absolute capacitance of one or more of the sensor electrodes. In another embodiment, the sensor electrodes may be operated such that the absolute capacitive sensing signal is driven on a sensor electrode in multiple capacitive pixels 205 at the same time. In such embodiments, an absolute capacitive measurement may be obtained from each of the one or more capacitive pixels 205 simultaneously. In one embodiment, the input device 100 simultaneously drives a sensor electrode in a plurality of capacitive pixels 205 and measures an absolute capacitive measurement for each of the capacitive pixels 205 in the same sensing cycle. In various embodiments, processing system 110 may be configured to selectively drive and receive with a portion of sensor electrodes. For example, the sensor electrodes may be selected based on, but not limited to, an application running on the host processor, a status of the input device, an operating mode of the sensing device and a determined location of an input device. The host processor may be central processing unit or any other processor of an electronic device.

A set of measurements from the capacitive pixels 205 form a capacitive image or capacitive frame representative of the capacitive couplings at the pixels 205 as discussed above. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

In some embodiments, one or more of the sensor electrodes in the capacitive pixels 205 include one or more display electrodes used in updating the display of the display screen. In one or more embodiment, the display electrodes comprise one or more segments of a common voltage electrode, also referred to as a Vcom electrode, a source drive line, gate line, an anode electrode or cathode electrode, or any other display element. These display electrodes may be disposed on an appropriate display screen substrate. For example, in display screens such as In Plane Switching (IPS) and Plane to Line Switching (PLS) Organic Light Emitting Diode (OLED), the display electrodes may be disposed on a transparent substrate, e.g., a glass substrate, TFT glass, or any other transparent material,). In other embodiments, in display screens such as Patterned Vertical Alignment (PVA) and Multi-domain Vertical Alignment (MVA), the display electrodes may be disposed on the bottom of a color filter glass. In one or more embodiments, the display electrodes may be disposed over an emissive layer of an OLED display. In such embodiments, an electrode that is used as both a sensor electrode and a display electrode can also be referred to as a combination electrode, since it performs multiple functions.

Continuing to refer to FIG. 2, in various embodiments, the processing system 110 coupled to the sensing electrodes includes a sensor module 204 and optionally, a display driver module 208. In one embodiment, the sensor module 204 comprises circuitry configured to drive a transmitter signal or an absolute capacitive sensing signal onto the sensing electrodes and receive resulting signals with the sensing electrodes during periods in which input sensing is desired.

In one or more embodiments, the sensor module 204 comprises a transmitter module including circuitry configured to drive a transmitter signal onto the sensing electrodes during periods in which input sensing is desired. In one or more embodiments, the transmitter signal is modulated and contains one or more bursts over a period of time allocated for input sensing. In one embodiment, each burst includes multiple cycles. Each cycle may include a positive and negative voltage transition. The transmitter signal may have an amplitude, frequency and voltage which may be changed to obtain more robust location information of the input object in the sensing region 120. The absolute capacitive sensing signal may be the same or different from the transmitter signal used in transcapacitance sensing. The sensor module 204 may be selectively coupled to one or more of the sensor electrodes in the capacitive pixels 205. For example, the sensor module 204 may be coupled to selected portions of the sensor electrodes and operate in either an absolute or transcapacitance sensing mode. In another example, the sensor module 204 may be coupled to different sensor electrodes when operating in the absolute sensing mode than when operating in the transcapacitance sensing mode.

In various embodiments, the sensor module 204 comprises sensor circuitry and the sensor module is configured to receive a resulting signal with the sensing electrodes comprising effects corresponding to the transmitter signal during periods in which input sensing is desired. In one or more embodiments, the sensor module 204 is configured to receive a resulting signal from a sensor electrode that is driven with an absolute capacitive sensing signal to determine changes in absolute capacitance between the sensor electrode and an input object. In one or more embodiments, the sensor module 204 determines a position of the input object in the sensing region 120. In one or more embodiments, the sensor module 204 provides a signal including information indicative of the resulting signal to another module or processor such as a determination module of the processing system 110 or a processor of the electronic device, e.g., a host processor, for determining the position of the input object in the sensing region 120. In one or more embodiments, the sensor module comprises a plurality of receivers, where each receiver may be an analog front end (AFE).

In one or more embodiments, capacitive sensing or input sensing and display updating may occur during at least partially overlapping periods. For example, as a combination electrode is driven for display updating, the combination electrode may also be driven for capacitive sensing. Overlapping capacitive sensing and display updating may include modulating the reference voltage(s) of the display device and/or modulating at least one display electrode for a display in a time period that at least partially overlaps with when the sensor electrodes are configured for capacitive sensing. In another embodiment, capacitive sensing and display updating may occur during non-overlapping periods, also referred to as non-display update periods. In various embodiments, the non-display update periods may occur between display line update periods for two display lines of a display frame and may be at least as long in time as the display update period. In such embodiment, the non-display update period may be referred to as a long horizontal blanking period, long h-blanking period or a distributed blanking period. In other embodiments, the non-display update period may comprise horizontal blanking periods and vertical blanking periods. Processing system 110 may be configured to drive sensor electrodes for capacitive sensing during any one or more of or any combination of the different non-display update times.

The display driver module 208 includes circuitry configured to provide display image update information to the display of the display device during non-sensing periods, e.g., display updating periods. The display driver module 208 may be included with or separate from the sensor module 204. In one embodiment, the processing system comprises a first integrated controller comprising the display driver module 208 and at least a portion of the sensor module 204. The sensor module 204 may comprise a transmitter circuitry and/or a receiver circuitry. In another embodiment, the processing system comprises a first integrated controller comprising the display driver module 208 and a second integrated controller comprising the sensor module 204. In yet another embodiment, the processing system comprises a first integrated controller comprising a display driver module 208 and one of a transmitter circuitry and a receiver circuitry and a second integrated controller comprising the other one of the transmitter circuitry and receiver circuitry.

As mentioned above, the sensing region 120 of the input device 100 may be configured for both touch sensing and display updating. In some examples, the input device 100 includes an integrated circuit (IC) chip that is configured for touch sensing and display updating and may be referred to as a touch and display driver integration (TDDI) chip. Capacitive touch sensing devices, including those incorporating TDDI chips, use a drive signal for capacitive sensing. The processing system 110 can include a waveform generator. In one embodiment, the waveform generator may be a direct digital synthesizer (DDS) circuit. The waveform generator may also be referred to as a digital signal generator or a digital waveform generator. In one embodiment, touch sensing may refer to performing capacitive sensing to detect one or more input objects (e.g., input objects 140) that are positioned within sensing region 120 of the input device 100. For example, a first input object may be positioned within the sensing region 120 may be in contact with an input surface of the input device 100 and/or a second input object may be proximate but not in direct contact with the input surface of the input device 100.

In one or more embodiments, the waveform generator may include synchronous digital circuitry that reads digital data from a RAM table and clocks the data into a digital-to-analog converter (DAC) to create waveforms. For example, the waveform generator may include a digital block that outputs an 8-bit code that drives the DAC. The waveform generator may generate a waveform such as an arbitrary periodic analog voltage waveform. In some embodiments, the waveform is used as a sensing signal for capacitive sensing and a guard signal, Vguard. The Vguard guards the capacitance associated with capacitive touch sensing electrodes. The waveform generator may generate the shape of the sensing signal by populating the RAM table with samples of the waveform. Various circuit components of the waveform generator may be configured to address the RAM table during each half period of the waveform. In one or more embodiments, the sensing frequency of the sensing signal may be changed to avoid noises.

One or more embodiments provide a waveform generator with a programmable period of the arbitrary waveform. The programmable period of the arbitrary waveform allows for a flexible sensing frequency that may be finely tunable. For example, a finely tunable sensing frequency may correspond to a sensing frequency that may be shifted by about 1 to 300 KHz. In other embodiments, the sensing frequency may be shifted by other amounts. One or more embodiments provide a trapezoidal voltage waveform output by the waveform generator. Various embodiments leverage the flexible sensing frequency and trapezoidal voltage waveform to reduce shift in the baseline capacitance measurements when shifting between sensing frequencies.

One or more embodiments provide a new waveform generator design. The waveform generator design may allow more flexible access to a RAM table. In some examples, the waveform generator includes truncation circuitry allowing fraction bit access to the RAM table. The more fine granularity access to the RAM table may allow fine tuning changes to the number of clock cycles of the waveform generator clock signal and, accordingly, fine granularity to switching of the period of the waveform and, thereby, the sensing frequency. Greater flexibility in switching the sensing frequency may enable better interference immunity during sensing.

In some examples, the new waveform generator design also includes saturation circuitry and DC offset circuitry that permits more flexibility in generating the shape of the waveform such as a trapezoidal waveform, for example, to control electromagnetic interference (EMI) emission.

In some examples, the new waveform generator design also includes phase increment circuitry that can also be finely tuned to preserve harmonic properties of the waveform. The harmonic properties of the waveform may correspond to the amount of interference that negatively affects the waveform at the harmonics of the waveform.

In some examples, the new waveform generator design also includes interpolation circuitry that can be used to perform interpolation of samples allowing for compression leading to reduced RAM size in the waveform generator.

Figure 3:
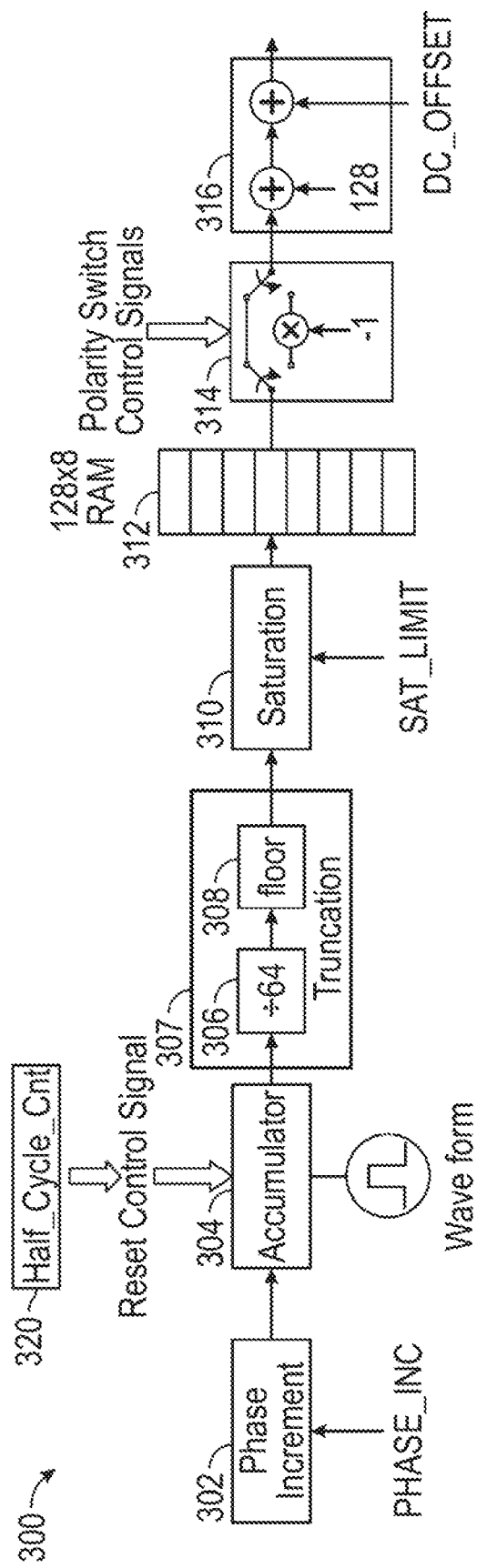
FIG. 3 is a block diagram of an example waveform generation circuit, according to one or more embodiments.

FIG. 3 is a block diagram of an example waveform generator 300, according to one or more embodiments. The waveform generator 300 may include phase increment circuitry 302, accumulator circuitry 304, and truncation circuitry 307 and may be configured for generating the flexible waveform period. The waveform generator 300 may include saturation circuitry 310 that may be configured for generating a flat-top of the waveform. The waveform generator 300 may include RAM table 312 and polarity switch 314. In various embodiments, the waveform generator 300 includes control signal circuitry 320 configured to output reset control signal based on a HALF_CYCLE_CNT register. The waveform generator 300 may include DC offset circuitry 316 that may be configured for applying a DC offset to the waveform. PHASE_INC, SAT_LIMIT, HALF_CYCLE_CNT, and DC_OFFSET may refer to separate ASIC registers, which are sometimes referred to as "knobs."

The waveform generator 300 may generate a full waveform by generating two half periods, that are anti-symmetric. For example, the two half periods may be similar in shape but opposite in polarity. For example, the polarity switch 314 may include circuitry configured to switch the polarity each half period based on polarity switch control signals.

In one or more embodiments, the waveform is a modulated signal and contains one or more bursts over a period of time. Further, in one or more embodiment, each burst includes a multiple cycles of positive and negative voltage transitions.

The phase increment circuitry 302 may be communicatively coupled to the ASIC register configured to program the phase increment. The ASIC register may be referred to as PHASE_INC. The phase increment may dictate how fast (or by how many addressed at a time) the waveform generator 300 works through the RAM table. The phase increment circuitry 302 may increment a value of the RAM address by some amount after each clock cycle of a clock signal.

The accumulator circuitry 304 may take the PHASE_INC, the clock signal, and a reset control signal as input. Over the course of the half period, the accumulator circuitry 304 accumulates the PHASE_INC value. The PHASE_INC value may be provided by the phase increment circuitry 302 or input into the waveform generator 300. The addresses for accessing the RAM table 312 may be generated by processing the accumulated PHASE_INC value on each rising edge of the waveform generator clock signal. At the end of the half period, the accumulator circuitry 304 may be reset based on the reset control signals, restarting the generation of the half periods of the waveform.

In some examples, the period of the waveform may be controlled by the timing of the reset control signals. The accumulator reset may be initiated after an integer number of clock cycles of the waveform generator clock signal to restart a new half cycle of the waveform. In one or more embodiments, the integer number of clock cycles input to the accumulator circuitry 304 may be programmable. For example, the register HALF_CYCLE_CNT may be utilized to program the number of clock cycles in a single half period.

In some embodiments, the waveform is of a sensing signal used for capacitive sensing, and controlling the period of the waveform controls a sensing frequency of the capacitive sensing signal.

The period, T, of the waveform may be expressed according to the following equation:

$$T = \frac{2 * \text{HALF\_CYCLE\_CNT}}{F_{DDSCLCK}},$$

where $F_{DDSCLCK}$ is the frequency of the waveform generator clock signal.

The sensing frequency, may be controlled by the HALF_CYCLE_CNT according to the following equation:

$$f_{sence} = \frac{1}{2 * \text{HALF\_CYCLE\_CNT} * \delta t},$$

where $$\delta t = \frac{1}{F_{DDSCLCK}}.$$

In one or more embodiments, discussed in more detail below, the PHASE_INC can also be changed along with the HALF_CYCLE_CNT to change the sensing frequency.

In some embodiments, the RAM table has 128 elements, that can be accessed in four ways: all 128 elements in the RAM, one by one; 64 elements in the RAM by accessing every other element in the RAM table; 32 elements in the RAM by accessing every fourth element in the RAM table; or 16 elements in the RAM by accessing every eighth element in the RAM table. In one or more embodiments, the waveform generator 300 has greater flexibility in accessing the RAM table. The waveform generator 300 may be able to access an expanded set of periods, which may improve immunity to interference. The greater flexibility in accessing the RAM table may also permit greater flexibility in defining the shape of the edge of the guarding voltage waveform generated by the waveform generator 300, which may provide better control of electromagnetic interference (EMI) emissions, while maintaining a stable baseline.

In one embodiment, flexibility when addressing the RAM table 312 enables flexibly changing the period of the waveform. In one or more embodiment, instead of moving one index per rising edge of the waveform generator clock signal, or moving two indices per rising edge of the waveform generator clock signal, a fractional number of indices per rising edge of the waveform generator clock signal may be moved. The truncation circuitry 307 in the waveform generator 300 may be configured for dropping certain bits, such as least significant bits (LSBs). The truncation circuitry 307 may include divide-by-64 operation circuitry 306 and floor operation circuitry 308 that enable six fractional bits of accumulation. For example, the divide-by-64 operation circuitry 306 may divide the accumulated PHASE_INC value from the accumulation circuitry 304 and the floor operation circuitry 308 drops a portion of the bits, resulting in factional bits. In some embodiments, the ability to increment the RAM address by a 6-bit fraction allows the waveform generator 300 to increment the RAM address by 1.0156 elements per rising edge of the clock cycle of the waveform generator clock signal. In one or more embodiments, the RAM table 312 may only store information for a single half period of the arbitrary waveform.

In one or more embodiments, interpolation may be performed between the values of the RAM (e.g., between samples), such as between the 6 fractional bits. Various interpolation techniques may be used such as, but not limited to, linear interpolation or quadratic interpolation. In this case, fewer sample points may be stored in the RAM and, therefore, the size of the RAM table 312 may be reduced. This may allow massive RAM compression of simple waveforms, reducing the RAM buffer size, and may use the full resolution of the output DAC.

Figure 4:
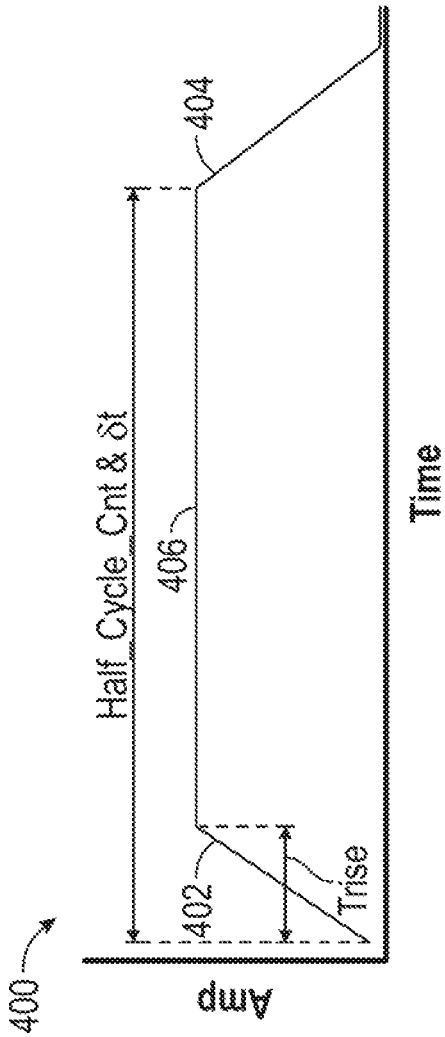
FIG. 4 illustrates an example trapezoidal sensing waveform that may be output by a waveform generator, according to one or more embodiments.

In one or more embodiments, the waveform generator 300 may generate trapezoidal waveforms. FIG. 4 illustrates an example trapezoidal waveform 400 that may be output by the waveform generator 300. The trapezoidal waveform 400 may have three main parts: the rising edge 402, the falling edge 404, and the flat-top portion 406 in the middle.

In one or more embodiments, the digital data associated with the flat-top portion 406 of the trapezoidal waveform 400 may be explicitly stored in the RAM table 312. In one or more other embodiments, the flat-top portion 406 of the trapezoidal waveform 400 may not be stored in the RAM table 312. Instead, the last sample of the rising edge 402 may be held until the falling edge 404 of the waveform 400 has been reached. The advantage of generating the trapezoidal waveform in this fashion is that the RAM table 312 of the waveform generator 300 may not be completely reprogrammed in order to maintain a stable baseline.

The rising edge 402 may be controlled by the phase increment circuitry 302 and the saturation circuitry 310. For example, the rising edge 402 may be controlled according to the following equation of rise time $T_{rise}$:

$$\left(\frac{(SAT\_LIMIT+1)}{PHASE\_INC}\right)\delta t,$$

or $$T_{rise} = \left\lceil \frac{64\left(\frac{SAT\_LIMIT}{PHASE\_INC}\right)}{F_{DDSCLK}} \right\rceil.$$

In some examples, the waveform generator 300 may generate waveforms at frequencies around 150 KHz. For example, the waveform generator 300 may generate waveforms at 149.7 KHz and/or 150.6 KHz. In one or more embodiments, the spacing between the two frequencies may be less than 1 KHz. For small frequencies, the spacing between two adjacent frequencies may also be smaller.

In one or more embodiments, the waveform generator 300 generates the flat-top portion 406 of the trapezoidal waveform 400 by the saturation circuitry 310. The saturation circuitry 310 may enforce a saturation limit (which may also be referred to as SAT_LIMIT). For example, after the accumulation and truncation by the accumulation circuitry 304 and truncation circuitry 307, the saturation circuitry 310 may determine whether the PHASE_INC is below, at, or above the SAT_LIMIT. In one embodiment, once the accumulated and processed PHASE_INC produces an address at or above the SAT_LIMIT, the generated addresses cease to rise, effectively holding the same address for several edges of the waveform generator clock signal, which creates the flat-top portion 406. The edges may be rising edges of the waveform generator clock signal. In one or more embodiments, there may be many different possible SAT_LIMIT values that can be used to meet the waveform design objectives. In one or more embodiments, the flat-top portion 406 can be generated to be long enough for the sensor to settle in order to keep the baseline capacitance from changing.

In one example of generating the flat-top portion 406 of the trapezoidal waveform 400, for a rise time of 1 μs and a period of T=10 μs, a waveform generator clock frequency of $F_{DDSCLK}$=50 MHz, and a SAT_LIMIT=63, then according to the equation above for the period, T, the HALF_CYCLE_CNT=250. Thus, the number of clock cycles of the waveform generator clock signal in each half period is 250. In this example, the RAM table 312 should be loaded with values that progress linearly from the minimum value at RAM address 0 to the maximum value at RAM address 63. Thus, from the equation above for the rise time, $T_{rise}$, in this example the PHASE_INC=81. This means that, in this example, after 50 clock cycles of the waveform generator clock signal, the RAM address will be at 63. Because the RAM addresses are saturated at 63, the remaining 200 clock cycles of the waveform generator clock signal will address the same RAM value at address 63, thereby creating the flat-top portion 406 of the trapezoidal waveform 400.

In one or more embodiments, the waveform generator 300 may generate sinusoidal waveforms. One way to generate a sinusoidal waveform is to load all 128 elements of the RAM with half period of a sinusoid. In this case, the value of PHASE_INC 302 may be set according to the following equation:

$$PHASE_{INC} = \text{round}\left(64\left(\frac{127}{HALF\_CYCLE\_CNT-1}\right)\right).$$

This relationship may produce non-integer PHASE_INC values. In one or more embodiment, multiplying by 64, before the rounding operation, limits the round off error that occurs during the computation of PHASE_INC. In various embodiments, the divide-by-64 operation circuitry 306 and the floor operation circuitry 308 after the accumulator circuitry 304 in the waveform generator 300 prevents the rounding error for the PHASE_INC from becoming too large, which could result in distortion of the sinusoidal waveform generated. Further, in some embodiments, the divide-by-64 operation followed by the flooring operation maximizes the set of allowable periods, while keeping distortion to an absolute minimum.

In one or more embodiments, as mentioned above, the sensing frequency is altered by the HALF_CYCLE_CNT. In one or more embodiments, to shift the sensing frequency while preserving the baseline, the sensing frequency may be changed by only changing the HALF_CYCLE_CNT, while keeping the PHASE_INC fixed. In this case, the rising edge 402 duration, $T_{rise}$, will remain fixed and only the duration of the flat-top portion 406 of the trapezoidal waveform 400 will change.

As mentioned above, in one or more embodiments, the PHASE_INC can be changed also. This may preserve the harmonic structure of the sensing signal. The harmonic properties of the waveform may be preserved if the ratio between the duration of the edge 402, $T_{rise}$, and the sensing cycle period, T, is preserved while switching frequency. In one or more embodiments, the ratio may be preserved by changing the duration of the edge by changing the PHASE_INC. If the new sensing frequency is denoted as f, and the current sensing frequency is denoted as $f_0$, the current gear and new gear may be related by $f_1=\alpha f_0$, and then the new HALF_CYCLE_CNT$_1$ and current HALF_CYCLE_CNT$_0$ may be related by HALF_CYCLE_CNT$_1$=(1/α) HALF_CYCLE_CNT$_0$. Thus, in order to preserve the ratio of the edge to the sensing cycle period, the current PHASE_INC$_0$ may be changed to the new PHASE_INC$_1$ according to PHASE_INC$_1$=α PHASE_INC$_0$. In other words, if the sensing period is doubled, for example, by scaling the HALF_CYCLE_CNT by two, then to preserve the harmonic properties of the waveform, the duration of edge should also be doubled by scaling the PHASE_INC by one-half to maintain the same ratio.

In some embodiments, the HALF_CYCLE_CNT is a 10 bit unsigned integer, such as 0.10.0 (sign, magnitude, fraction) number. In some examples, a small HALF_CYCLE_CNT may be around 40. An example sensing frequency of 300 kHz and an example waveform generator clock frequency may be 25 MHz. If the HALF_CYCLE_CNT is changed to 41, then the new sensing frequency becomes 40/41, which is 97% of the original HALF_CYCLE_CNT. Thus, even for a small HALF_CYCLE_CNT, 3% frequency granularity is achieved for changing the sensing frequency. In this example, to preserve the harmonic properties of the waveform, the PHASE_INC should be changed by 41/40 when the sensing frequency is shifted. In one embodiment, the PHASE_INC is a 0.3.6 (sign, magnitude, fraction) number, that may range from (0.8) decimal. In such an embodiment, 6 fractional bits may be sufficient to preserve the harmonic properties.

In an illustrative example of switching sensing frequencies, an initial HALF_CYCLE_CNT=128, an initial PHASE_INC=1, an initial $F_{DDSCLK}$=25 MHz, and the initial $f_{sense}$=97.65 KHz. In one or more embodiments, to increase the sensing frequency to the next higher sensing frequency, the HALF_CYCLE_CNT may be changed to 127, giving $f_{sense}$=98.425 KHz. In various embodiments, to increase the sensing frequency with stable baseline, the PHASE_INC=1 may not be changed. Further, in an embodiment, to increase the sensing frequency with stable harmonic properties, the PHASE_INC may be scaled as close as possible to 127/128 to PHASE_INC=1.0079. The closest PHASE_INC in this example is $(1+2^{-6})$=1.0156. In one or more embodiments, to achieve a better matter between the scaled and available PHASE_INC, the spacing of the switched sensing frequencies may be increased.

In one or more embodiments, separate registers may be used for tuning the sensing frequency for the stable baseline approach and for the stable harmonic approach (i.e., the PHASE_INC and HALF_CYCLE_CNT registers).

In one or more embodiments, the waveform generator 300 comprises polarity switch 314 configured to perform an inversion operation based on polarity switch control signals. The polarity switch 314 may be communicatively coupled to the RAM table 312. During one half period, the polarity switch 314 may multiply the digital data from the RAM table 312 by 1, and during the other half period, the polarity switch 314 may multiply the same digital data from the RAM by −1. Thus, the RAM table 312 can store samples for only half the period, and the waveform for the entire period is generated using the polarity switch 314.

In one or more embodiments, the waveform generator 300 comprises DC offset circuitry 316 configured to apply DC_OFFSET at the end of the waveform generator 300. The DC_OFFSET may give the waveform generator added flexibility to generate a very well controlled DC voltage in the analog waveform.

Figure 5A:
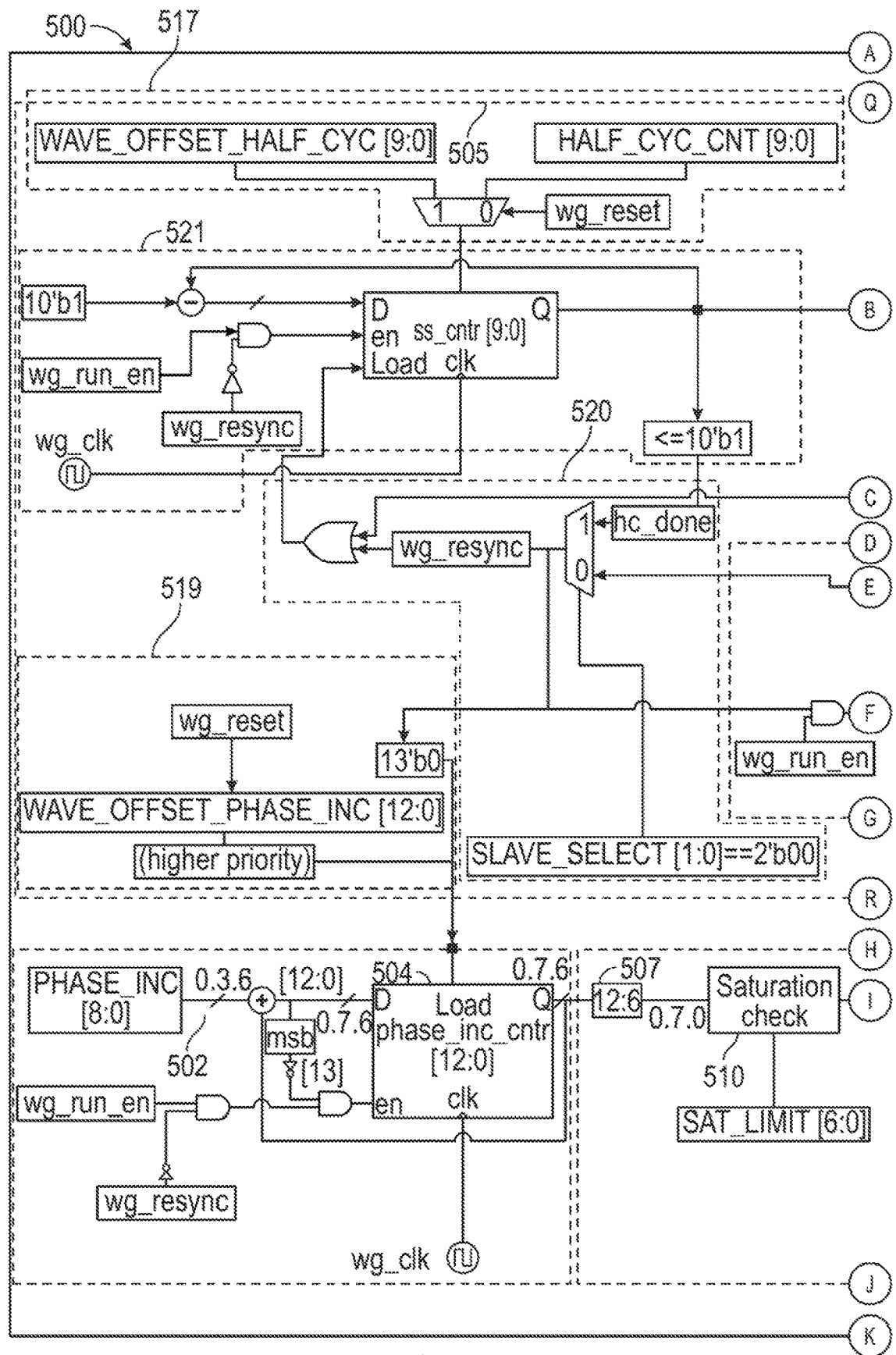
FIGS. 5A, 5B, and 5C are detailed diagrams of an example waveform generator, according to one or more embodiments.
Figure 5B:
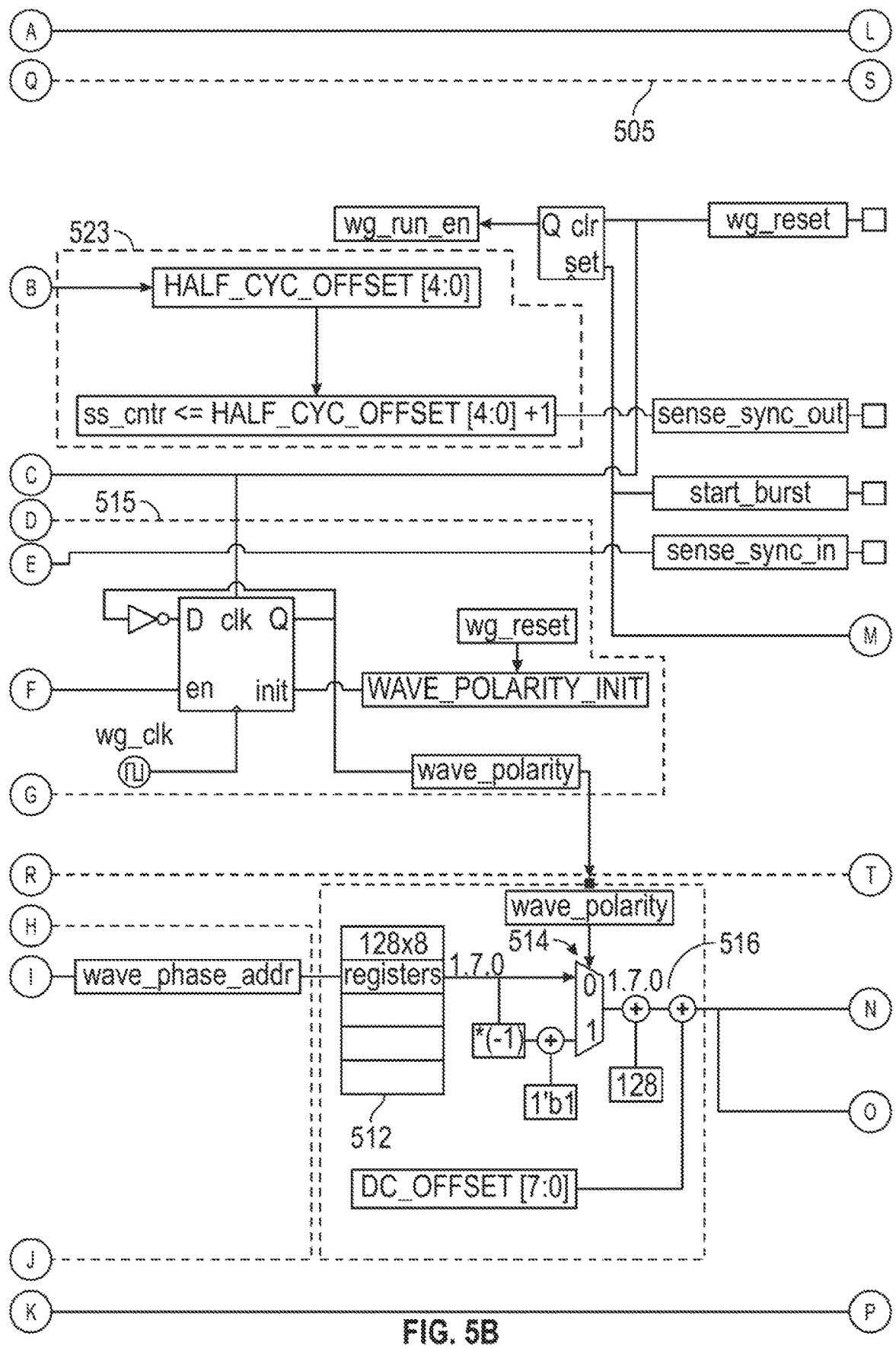
Figure 5C:
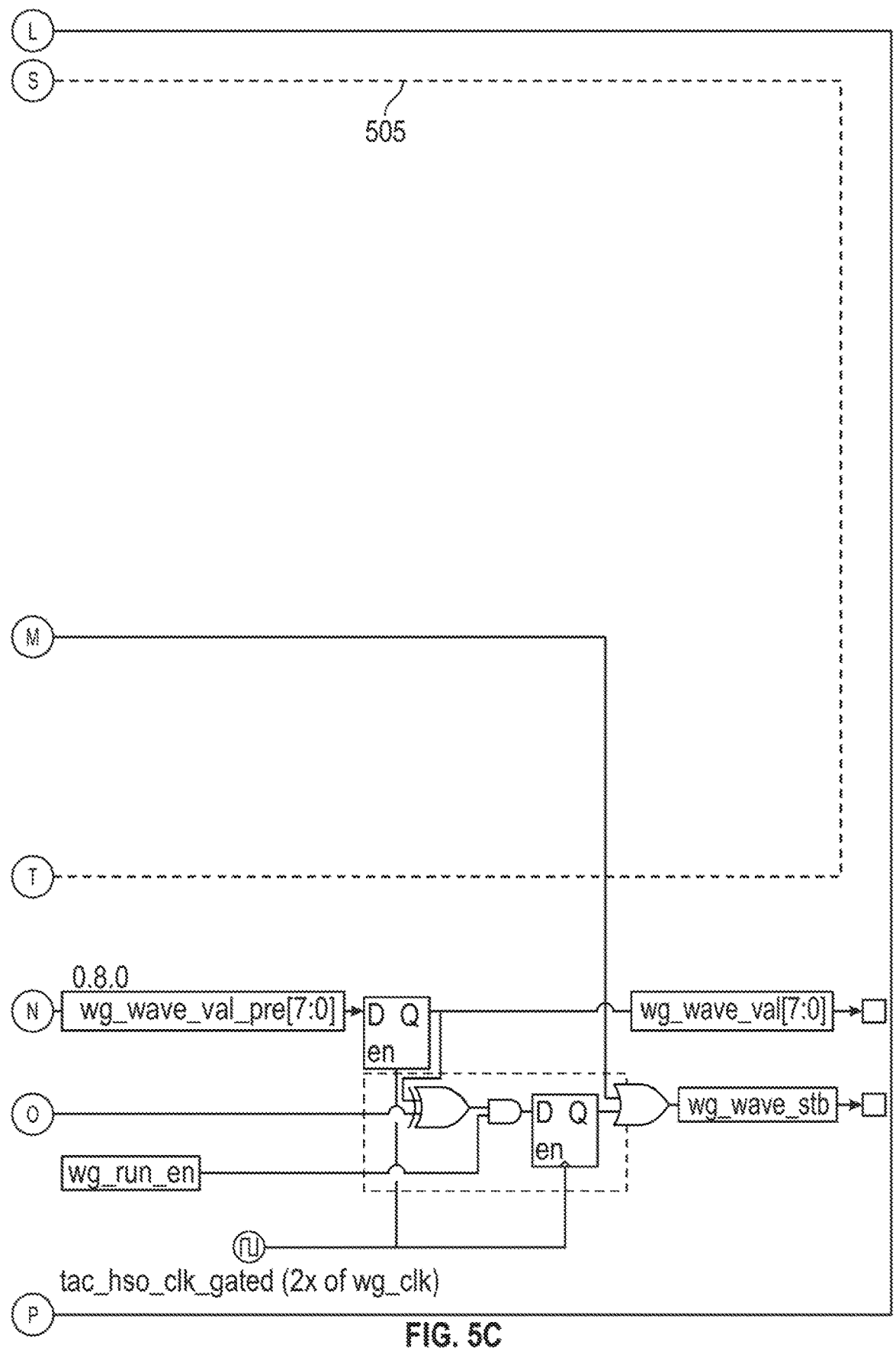

FIG. 5 is a detailed diagram of an example waveform generator 500, according to one or more embodiments. As shown in FIG. 5, the waveform generator 500 may include phase increment circuitry 502. As discussed above, the phase increment circuitry 502 may provide a PHASE_INC value. The PHASE_INC value may be programmable and may be changed to adjust the rising edge duration of the output waveform, such as for the rising edge 402 of the trapezoidal waveform 400. In some examples, the PHASE_INC value is adjusted to maintain a ratio of the rising edge and the period of the waveform, when the period of the waveform is changed, to preserve harmonic properties of the waveform.

As shown in FIG. 5, the waveform generator 500 may include accumulator circuitry 504. As discussed above, the accumulator circuitry 504 may be coupled to the phase increment circuitry 502 and may receive the PHASE_INC value. The accumulator circuitry 504 may operate according to the waveform generator clock signal (wg_clk). The accumulator circuitry 504 may receive reset control signals from control signal circuitry 505. For example, the control signal circuitry 505 may be configured to generate the reset control signals based on HALF_CYCLE_CNT. The HALF_CYCLE_CNT may be an independent counter that controls the timing for the sensing frequency. As discussed above, the HALF_CYCLE_CNT may be changed to control the period of the waveform and, thereby, the sensing frequency. The accumulator circuitry 504 may accumulate the PHASE_INC from the phase increment circuitry 502 and output an accumulated PHASE_INC value.

In one embodiment, the waveform generator 500 may include the truncation circuitry 507. As discussed above, the truncation circuitry 507 may include circuitry for divide-by-64 and floor operations on the accumulated PHASE_INC value from the accumulator circuitry 504. The truncation circuitry 507 may output fractional bits for addressing the RAM. The fractional bit addressing may allow more flexibility and fine granularity in accessing the RAM, which in turn allows fine granularity in the control of the HALF_CYCLE_CNT and, thus, fine granularity in switching the sensing frequency.

In one or more embodiments, the waveform generator 500 includes the saturation circuitry 510. As discussed above, the saturation circuitry 510 may perform a saturation check to compare the fractional bit addresses from the truncation circuitry 507 to the programmable SAT_LIMIT. Once the SAT_LIMIT is reached, the saturation circuitry 510 maintains the current RAM address. Thus, the saturation circuitry 510 may be configured for generating a flat-top portion of the waveform (such as the flat-top portion 406 of the trapezoidal waveform 400), which may be a trapezoidal waveform. In some examples, the saturation circuitry 510 may control the duration of the flat-top portion of the waveform to maintain a stable baseline capacitance, for example, by ensuring that the duration of the flat-top portion of the waveform is at least as long as a duration for a sensing electrode to settle.

In one embodiment, the waveform generator 500 may include the RAM table circuitry 512. As discussed above, the RAM table circuitry 512 may store sample of the waveform. In some examples, the RAM table circuitry 512 only stores samples for a half period of the waveform. In some examples, the RAM table circuitry 512 only stores a portion of the sample for the waveform, such as in configurations where the waveform generator 500 is configured to perform interpolation between samples.

In one embodiment, the waveform generator 500 may include the polarity switch circuitry 514. As discussed above, the polarity switch circuitry 514 may be configured to multiply invert the same samples accessed from the RAM table circuitry 512 during each half period, allowing the waveform generator 500 to generate the entire waveform for a period while only the samples for the half period are stored in the RAM table circuitry 512. The polarity switch circuitry 514 may be controlled based on polarity switch initiation control signals from the control signal circuitry 505.

In one or more embodiments, the wave polarity counter 515 includes a 1 bit counter that may be configured to toggle between values. For example, the wave polarity counter 515 may include a 1 bit counter that toggles between values based on the programmable ASIC register referred to as WAVE_POLARITY_INIT.

As shown in FIG. 5, the waveform generator 500 may include DC offset circuitry 516. In one or more embodiments, as discussed above, the DC offset circuitry 516 may be configured to apply a DC offset value based on the ASIC register DC_OFFSET. The DC offset may further shape the output waveform.

In one or more embodiments, the control signal circuitry 505 may include a wave polarity counter 515, a half cycle count selector 517, phase control circuitry 519, resynchronization circuitry 520, and a waveform cycle counter 521.

In one or more embodiments, the half cycle count selector 517 is configured to control the length of the cycles of a waveform. For example, the half cycle count selector 517 may be configured to couple a WAVE_OFFSET_HALF_CYC register or a HALF_CYC_CNT register to the waveform cycle counter 521 to control the length of the half cycle of a waveform. In one embodiment, a waveform generator reset (wg_reset) signal is utilized to determine which of the WAVE_OFFSET_HALF_CYC register and the HALF_CYC_CNT register is coupled to the waveform cycle counter 521. The wg_reset signal may be provided at the beginning of each burst of the waveform. In one or more embodiments, when the wg_reset signal is high, the WAVE_OFFSET_HALF_CYC register is coupled to the waveform cycle counter 521. Further, in one embodiment, when the wg_reset signal is low, the HALF_CYC_CNT register is coupled to the waveform cycle counter 521. In one or more embodiments, the wg_reset signal is high once per burst of the waveform, accordingly, the WAVE_OFFSET_HALF_CYC register may be coupled to the waveform cycle counter 521 once per burst.

In one embodiment, the value of the WAVE_OFFSET_HALF_CYC register differs from the value of the HALF_CYC_CNT register. For example, the value of the HALF_CYC_CNT register may be greater than the value of the WAVE_OFFSET_HALF_CYC register. As such, the time difference between half cycles generated using the HALF_CYC_CNT register may be greater than the time different between half cycles generated using the WAVE_OFFSET_HALF_CYC register. Alternatively, in one or more embodiments, the value of the WAVE_OFFSET_HALF_CYC register may be greater than or equal to the value of the HALF_CYC_CNT register.

In one embodiment, the counter value of the waveform cycle counter 521 is initiated based on a register value from the half cycle count selector 517. For example, the counter value of the waveform cycle counter 521 may be initiated based on the value of the WAVE_OFFSET_HALF_CYC register or HALF_CYC_CNT register. The counter value is decremented on each rising edge of the waveform generator clock (wg_clk) signal and outputs a hc_done signal to the resynchronization circuitry 520 when the counter value satisfies a threshold. For example, when the counter value reaches the value of 1, the hc_done signal is output to the resynchronization circuitry 520. In other embodiments, other threshold values may be utilized. In one embodiment, the count value corresponds to a period of the half cycle of the waveform.

In one or more embodiments, the resynchronization circuitry 520 is configured to generate a waveform generator resynch (wg_resync) signal based on the hc_done signal. The wg_resync signal may be configured to resynchronize the waveform cycle counter 521 after each half cycle. In one embodiment, resynchronizing the waveform cycle counter 521 may comprise reinitializing the counter value based on a value from the half cycle count selector 517. Further, when the wg_reset signal is low, the wg_resync signal may be utilized to resynchronize the waveform cycle counter 521 and when the wg_reset signal is high, the wg_reset signal may be utilized to resynchronize the waveform cycle counter 521.

In one embodiment, the hc_done signal and a sense_sync_in signal are coupled to a multiplexer of the resynchronization circuitry 520. The sense_sync_in signal may be provided from a separate IC chip and may be used to synchronize waveform generator timing between the two IC chip. The multiplexer may select either the hc_done signal or the sense_sync_in signal based on the value of the slave_select register. For example, when the slave_select register value is 1, the hc_done signal may be selected and when the slave_select register value is 0, the sense_sync_in signal may be selected.

In various embodiments, the phase control circuitry 519 is configured to reset the accumulator circuitry 504. For example, the phase control circuitry 519 may couple the wg_resync signal or the value of the WAVE_OFFSET_PHASE_INC register to the accumulator circuitry 504. In one embodiment, when the wg_reset signal is high, the value of WAVE_OFFSET_PHASE_INC register may be provided to the to the accumulator circuitry 504. Further, when the wg_reset signal is low, the wg_reset signal may be provided to the accumulator circuitry 504.

In one or more embodiments, the wave polarity counter 518 is configured to output a wave_polarity signal to control the polarity switch circuitry 514. In one embodiment, the wave_polarity signal may have a value of 1 or 0. Further, in one or more embodiments, the value of the wave_polarity signal alternates in response to the wg_resync signal. For example, with each rising edge of the wg_resync signal, the value of the wave_polarity signal switches from 1 to 0 or from 0 to 1. In one embodiment, when the wave_polarity signal is 1, the polarity switch circuitry 514 outputs a signal based on inverted samples accessed from the RAM table circuitry 512, and when the wave_polarity signal is 0, the polarity switch circuitry 514 outputs a signal based on non-inverted samples accessed from the RAM table circuitry 512.

In one embodiment, the control signal circuitry 505 may generate an wg_run_en signal based on the wg_reset signal and a start_burst signal. The wg_run_en signal may be an enable signal that is configured to be high when the wg_reset signal is low. In one embodiment, the start_burst signal and the wg_reset signals may be an internal signal of the IC chip comprising the control signal circuitry 505. In other embodiments, at least one of the start_burst signal and the wg_reset signal are provided from another IC chip.

In one or more embodiments, the control signal circuitry 505 includes signal synchronization circuitry 523 configured to generate a sense_sync_out signal. The sense_sync_out signal may be utilized to synchronize waveform generation between at least two IC chips. For example, the sense_sync_out signal may be utilized to synchronize the generation of waveforms between waveform generators of multiple IC chips. The signal synchronization circuitry 523 may compare the value of a HALF_CYC_OFFSET register to a value of the waveform cycle counter 521, and generate the sense_sync_out signal based on the comparison. In one embodiment, when the value of the waveform cycle counter 521 is less than the value of the HALF_CYC_OFFSET register, the sense_sync_out signal is generated. In such an embodiment, the sense_sync_out signal may be generated before the hc_done signal is generated. Further, the value of the HALF_CYC_OFFSET register may be increased before it is compared to the value of the waveform cycle counter 521. For example, the value of the HALF_CYC_OFFSET register may be increased by 1 or more.

In various embodiments, varying the value of the HALF_CYC_OFFSET register varies the timing of when the sense_sync_out signal is generated. For example, a higher value of the HALF_CYC_OFFSET register may cause the sense_sync_out signal to be generated earlier than if the HALF_CYC_OFFSET register has a value of a lower value.

The sense_sync_out signal may be provided to another IC chip and utilized to generate a waveform by that IC chip. Varying when the sense_sync_out signal is generated may compensate for delays introduced by the routing between IC chips, such that waveforms for each IC chip are generated at substantially the same time.

Figure 6:
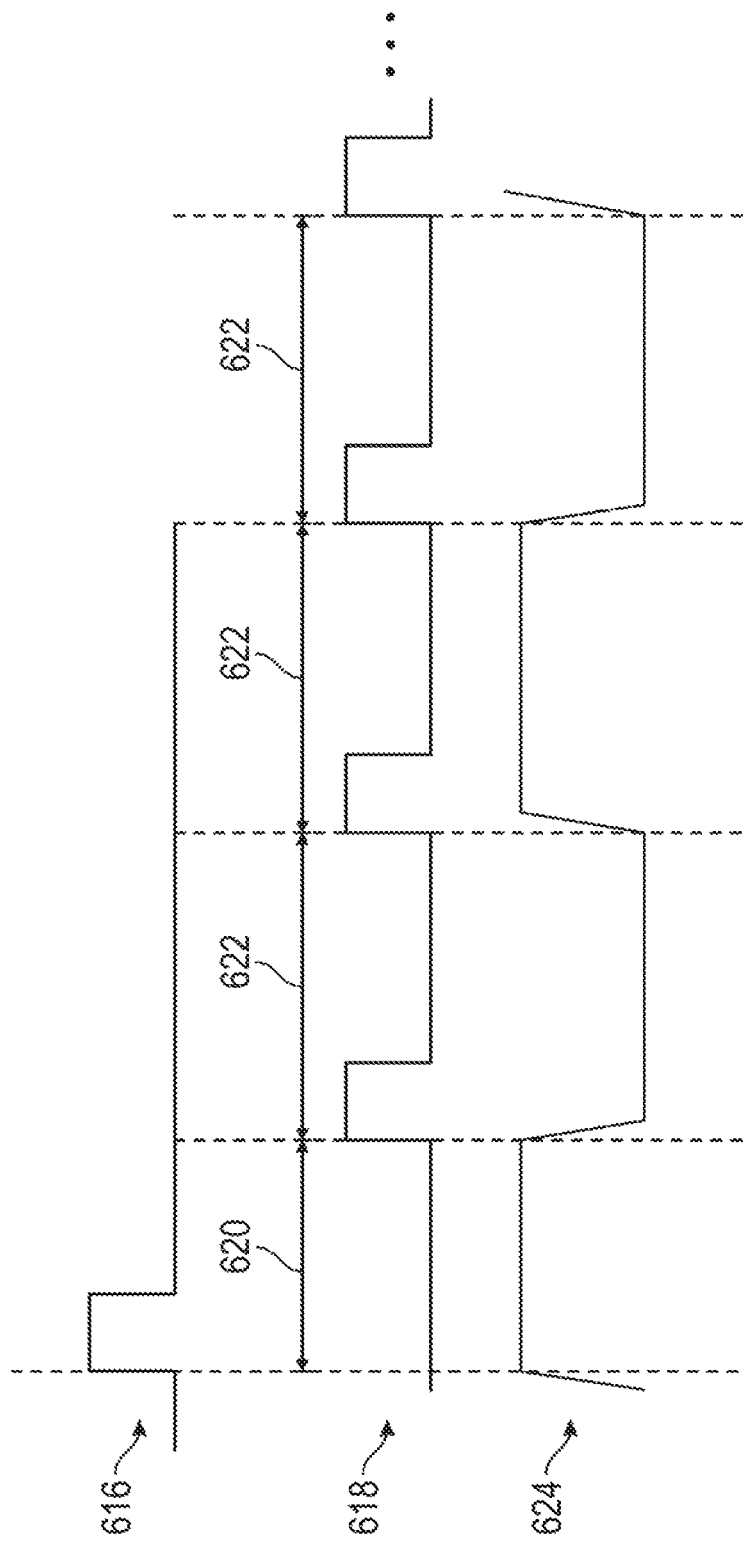
FIG. 6 illustrates example signals utilized in generating a waveform, according to one or more embodiments.

FIG. 6 illustrates various signals utilized in generation of a waveform, according to one or more embodiments. As illustrated, the signals include wg_reset signal 616, a wg_resync signal 618, and a waveform 624. In one embodiment, in response to the rising edge of wg_reset signal 616, a first cycle of the waveform 624 is initiated. Additional half cycles of waveform 624 may be initiated in response to the rising edges of the wg_resync signal 618. The half cycles of the waveform 624 may alternate in polarity such that each cycle has a positive voltage transition and a negative voltage transition. Further, the length of each half cycle may correspond to one of the timings 620 and 622. The timing 620 may correspond to a time difference between a rising edge of the wg_reset signal 616. Further, the timing 622 may correspond to a time difference between rising edges of the wg_resync signal 618. In one embodiment, the timing 622 corresponds to the value of the HALF_CYCLE_CNT register and the timing 620 corresponds to value of the WAVE_OFFSET_HALF_CYCLE register. In various embodiments, while waveform 624 is shown as a trapezoidal waveform, the waveform 624 may be a sinusoidal waveform, or any other shape. Further, the polarity of the waveform 624 may be flipped in one or more embodiments.

Figure 7:
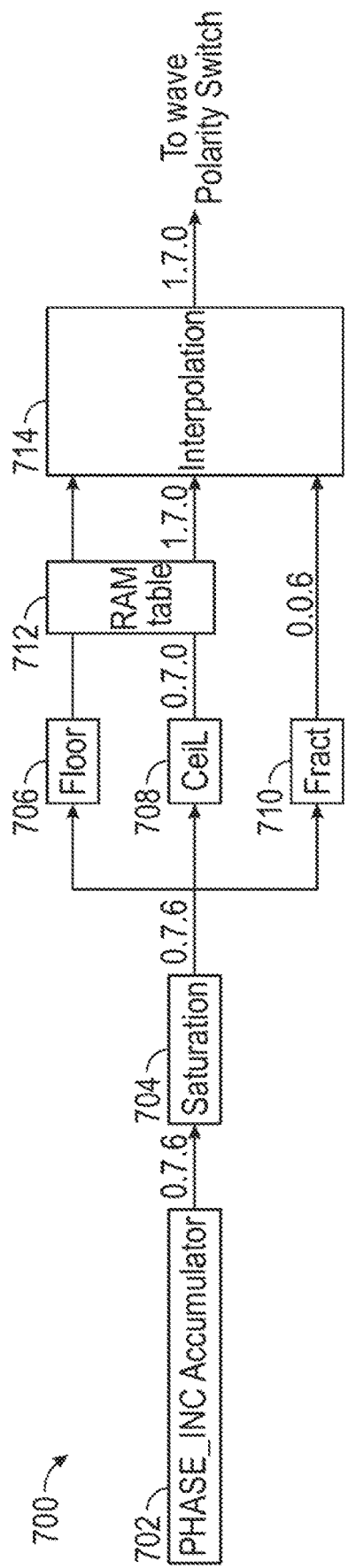
FIG. 7 is a block diagram of an example waveform generator, according to one or more embodiments.
Figure 8:
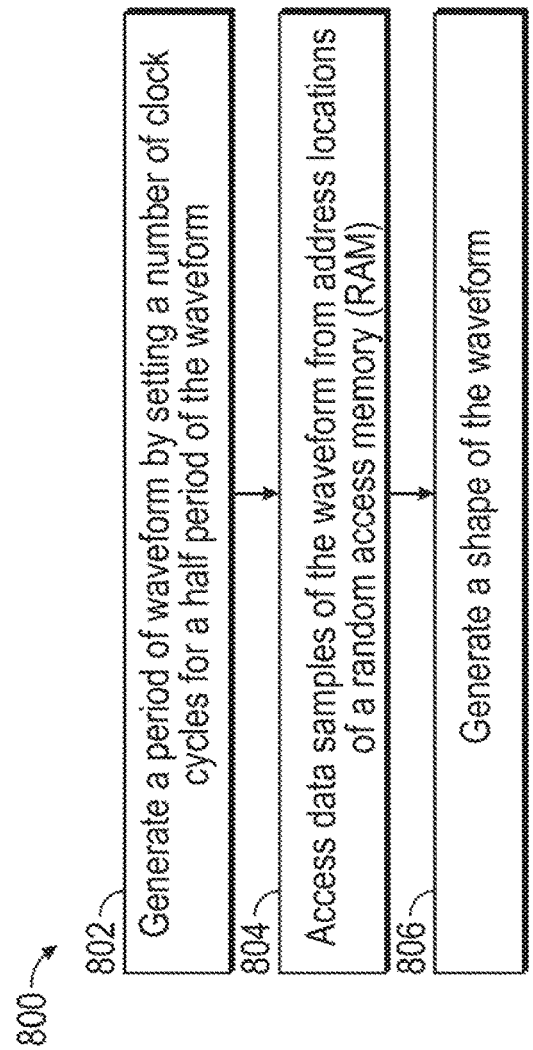
FIG. 8 is a flow diagram illustrating example operations for capacitive sensing, according to one or more embodiments.

As mentioned above, in some cases, interpolation may be performed between data samples. FIG. 7 is a block diagram of a portion of an example waveform generator 700 that is configured to perform interpolation, according to one or more embodiments. As shown in FIG. 7, the portion of the waveform generator 700 may include accumulator circuitry 702 configured to accumulate PHASE_INC values. The accumulator circuitry 702 may also include the phase increment circuitry. As shown in FIG. 8, unlike the waveform generator 500 shown in FIG. 5, the truncation circuitry may not be included between the accumulator circuitry 702 and the saturation circuitry 704. Instead, after the saturation circuitry 704, the waveform generator 700 may include floor index circuitry 706 configured to extract the floor index of the accumulator output, ceiling index circuitry 708 configured to extract the ceiling index of the accumulator output, and fractional circuitry 710 configured to extract the fractional part of the accumulator output. The floor index and the ceiling index may be used to retrieve two waveform points from the RAM table 712 (e.g., an ASIC register) that are used to perform the interpolation. In some examples, the RAM table 712 may be compressed, smaller, than the RAM table circuitry 512 in the waveform generator 500. After saturation, the same point (last point in buffer) may be selected.

As shown in FIG. 7, the waveform generator 700 may include interpolation circuitry 714. With both points and the fractional value, the interpolation circuitry 714 may generate an interpolated value (e.g., linearly interpolated) to use the full DAC quantization dynamic. The Interpolated values may be computed according the following formula:

Interpolated_result=fractional index*ceiling index+
(1−fraction index)*floor

FIG. 8 is a flow diagram illustrating an example method 800 for generating a waveform, according to one or more embodiments. Step 802 of the method 800 includes generating a period of a waveform by setting a number of clock cycles of a waveform generator clock signal for a half period of the waveform. In one embodiment, the waveform generator (e.g., 300, 500, 600) is configured to determine the number of clock cycles of a waveform generator clock signal that may be utilized to generate a half period of the waveform. The waveform may be of a sensing signal used for capacitive sensing. For example, the length of the half period may be increased or decreased by increasing or decreasing the number of clock cycles that are utilized to generate the half period.

At step 804, data samples of the waveform are accessed from address locations of a random access memory (RAM). For example, the accumulator circuitry (e.g., 304, 504, and 702) may be configured to access data samples of the waveform from address locations of a RAM. In one embodiment, the accumulator circuitry is configured to access the data samples by incrementing a RAM address value using a phase increment value, accumulating the phase increment value based on a clock cycle of a clock signal, and truncate the accumulated phase increment values to fractionally increment the RAM address value.

At step 806, the shape of the waveform is generated. For example, the saturation circuitry (e.g., 310, 510, and 704) may be configured to generate the shape of the waveform. In one embodiment, the saturation circuitry may be configured to generate the shape of the waveform by comparing the truncated value to a saturation limit. For example, if the truncated value is below the saturation limit, the saturation circuitry is configured to access a data sample from the corresponding RAM address. Further, if the truncated value is above the saturation limit, the saturation circuitry 310 is configured to access a data sample from a RAM address corresponding to the saturation limit. Further, the saturation circuitry 310 may be configured to output a signal corresponding to the accessed data samples.

The embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

What is claimed is:
1. A waveform generator, comprising:
  accumulator circuitry configured to accumulate a phase increment value based on a clock signal;
  truncation circuitry configured receive the accumulated phase increment value from the accumulator circuitry and to drop one or more bits of the accumulated phase increment value to generate a truncated value; and
  saturation circuitry configured to:
    compare the truncated value to a saturation limit;
    if the truncated value is below the saturation limit, access a data sample from a random access memory (RAM) address corresponding to the truncated value;
    if the truncated value is above the saturation limit, access a data sample from a RAM address corresponding to the saturation limit; and
    output a signal corresponding to the accessed data sample.
2. The waveform generator of claim 1, further comprising polarity switch circuitry configured to switch a polarity of the output signal based on a polarity switch initiation signal.
3. The waveform generator of claim 1, further comprising direct current (DC) offset circuitry configured to apply a DC offset to the output signal.
4. The waveform generator of claim 3, wherein the DC offset circuitry is further configured to output an offset signal to a digital-to-analog converter (DAC), the DAC configured to output a waveform corresponding to the offset signal.
5. The waveform generator of claim 1, further comprising control signal circuitry configured to output a reset control signal, wherein the accumulator circuitry is configured to reset the accumulated phase increment value based on the reset control signal.

6. The waveform generator of claim 5, wherein the control signal circuitry comprises a register containing a number of clock cycles in a half period of a waveform, the register being programmable to adjust the number of clock cycles to tune at least one of a period of the waveform and a frequency of the waveform.

7. The waveform generator of claim 1, further comprising phase increment circuitry configured to output the phase increment value.

8. The waveform generator of claim 1, configured to generate a trapezoidal waveform or a sinusoidal waveform.

9. The waveform generator of claim 8, further comprising phase increment circuitry configured to output the phase increment value, wherein the phase increment circuitry comprises a register programmable to adjust a duration of a rising edge of the trapezoidal waveform.

10. The waveform generator of claim 9, wherein the register of the phase increment circuitry is programmable to adjust the duration of the rising edge to maintain a ratio of the duration of the rising edge with respect to a period of the trapezoidal waveform.

11. The waveform generator of claim 8, wherein the saturation circuitry comprises a register programmable to adjust a duration of a flat top portion of the trapezoidal waveform.

12. The waveform generator of claim 11, wherein the register of the saturation circuitry is programmable to adjust the duration of the flap flat top portion of the trapezoidal waveform based on a settling time of a capacitive sensor.

13. The waveform generator of claim 1, wherein the truncation circuitry comprises:
 divide by sixty-four circuitry configured to perform a divide by sixty-four operation on the accumulated phase increment value; and
 floor circuitry configured to perform a floor operation on the output of the divide by sixty-four circuitry.

14. The waveform generator of claim 1, wherein the truncation circuitry is configured to output fractional bits to increment the RAM address.

15. The waveform generator of claim 1, further comprising interpolation circuitry configured to perform interpolation between first data samples accessed from the RAM to determine one or more interpolated data samples between the first data samples.

16. An input device comprising:
 a sensing device comprising a plurality of sensor electrodes and a sensing driver, the sensing driver communicatively coupled to the plurality of sensor electrodes and configured to acquire sensor data from the plurality of sensor electrodes by driving the plurality of sensor electrodes with a sensing signal; and
 a waveform generator comprising:
  circuitry configured to generate address bits for fractionally incrementing a random access memory (RAM) address per clock cycle to access samples of a waveform of the sensing signal;
  circuitry configured to change a frequency of the sensing signal by adjusting a number of clock cycles in a half period of the waveform; and
  circuitry configured to control a shape of the waveform by adjusting at least one of a phase increment value and a saturation limit value.

17. The input device of claim 16, wherein the circuitry configured to generate address bits comprises:
 accumulator circuitry configured to accumulate a phase increment value based on a clock of the waveform generator; and
 truncation circuitry configured to drop one or more bits of the accumulated phase increment value and generate a truncated value.

18. The input device of claim 17, wherein the accumulator circuitry is further configured to reset the accumulated phase increment value based on a reset control signal.

19. The input device of claim 17, wherein the circuitry configured to control a shape of the waveform comprises:
 saturation circuitry configured to:
  compare the truncated value to a saturation limit;
  if the truncated value is below the saturation limit, access a data sample from a random access memory (RAM) address corresponding to the truncated value;
  if the truncated value is above the saturation limit, access a data sample from a RAM address corresponding to the saturation limit; and
  output a signal corresponding to the accessed data sample.

20. The input device of claim 19, wherein the waveform generator further comprises:
 polarity switch circuitry configured to switch a polarity of the signal corresponding to the accessed data sample based on a polarity switch initiation; and
 direct current (DC) offset circuitry communicatively coupled to an output of the polarity switch circuitry and configured to:
  apply a DC offset to the signal; and
  output the offset signal to a digital-to-analog converter (DAC), the DAC configured to output a digital waveform corresponding to the sensing signal.

21. The input device of claim 19, wherein:
 the circuitry configured to control a shape of the waveform is configured to generate a trapezoidal waveform by:
  adjusting the phase increment value to adjust a duration of a rising edge of the trapezoidal waveform; and
  adjusting the saturation limit to adjust a duration of a flat top portion of the trapezoidal waveform.

22. The input device of claim 16, further comprising a display panel having a plurality of display electrodes, and wherein each of the plurality of sensor electrodes includes at least one of the plurality of display electrodes.

23. A method for generating a waveform, comprising:
 generating a period of the waveform by setting a number of clock cycles for a half period of the waveform;
 accessing a random access memory (RAM), wherein the accessing includes:
  incrementing a RAM address value using a phase increment value;
  accumulating the phase increment value based on a clock cycle; and
  truncating the accumulated phase increment value to generate a truncated value and fractionally increment the RAM address value; and
 generating a shape of the waveform, wherein generating the shape includes:
  comparing the truncated value to a saturation limit;
  if the truncated value is below the saturation limit, accessing a data sample from a RAM address corresponding to the truncated value;
  if the truncated value is above the saturation limit, accessing a data sample from a RAM address corresponding to the saturation limit; and outputting a signal corresponding to the accessed data sample.

24. The method of claim 23, wherein generating the shape of the waveform comprises generating a trapezoidal shape of the waveform by:
   setting the phase increment value to adjust a duration of a rising edge of the trapezoidal shaped waveform; and
   setting the saturation limit to adjust a duration of a flat top portion of the trapezoidal shaped waveform.

25. The method of claim 23, wherein truncating the accumulated phase increment value comprises:
   dividing the accumulated phase increment value by sixty-four; and
   performing a floor operation on a quotient.

26. The method of claim 23, further comprising performing interpolation between first data samples accessed from the RAM addresses to determine one or more interpolated data samples between the first data samples.

27. The method of claim 23, wherein the accessing further includes resetting the phase increment value based on a number of the clock cycles.

\* \* \* \* \*

UNITED STATES PATENT AND TRADEMARK OFFICE
CERTIFICATE OF CORRECTION

PATENT NO.           : 10,686,432 B2
APPLICATION NO.      : 16/201600
DATED                : June 16, 2020
INVENTOR(S)          : Jeremy Roberson, David Sobel and Damien Berget Page 1 of 1

It is certified that error appears in the above-identified patent and that said Letters Patent is hereby corrected as shown below:

In the Claims

Column 23 Line 31 In Claim 12, delete "flap flat" and insert -- flat --, therefor.

Signed and Sealed this
Sixth Day of October, 2020

Andrei Iancu
*Director of the United States Patent and Trademark Office*